United States Patent [19]

Zejda

[11] Patent Number: 4,938,858
[45] Date of Patent: Jul. 3, 1990

[54] CATHODE SPUTTERING SYSTEM

[75] Inventor: Jaroslav Zejda, Rodenbach, Fed. Rep. of Germany

[73] Assignee: Leybold Aktiengesellschaft, Fed. Rep. of Germany

[21] Appl. No.: 386,975

[22] Filed: Jul. 31, 1989

[30] Foreign Application Priority Data

Apr. 14, 1989 [DE] Fed. Rep. of Germany ....... 3912297

[51] Int. Cl.$^5$ ............................................. C23C 14/34
[52] U.S. Cl. ........................ 204/298.25; 204/192.12; 414/217; 414/222
[58] Field of Search .................. 204/298 SC, 298 SN, 204/298 MC, 298 MD, 298 MB, 298 MR, 298 MO, 298 EM, 192.12; 414/217, 222, 225

[56] References Cited

U.S. PATENT DOCUMENTS

| | | | |
|---|---|---|---|
| 3,532,072 | 10/1970 | Kiwiet | 118/301 |
| 3,904,930 | 9/1975 | Waldron et al. | 317/3 |
| 4,500,407 | 2/1985 | Boys et al. | 204/298 MC |
| 4,534,314 | 8/1985 | Ackley | 204/298 MC |
| 4,548,699 | 10/1985 | Hutchinson et al. | 204/298 MC |
| 4,558,388 | 12/1985 | Graves, Jr. | 204/298 MC |
| 4,663,009 | 5/1987 | Bloomquist et al. | 204/298 MC |
| 4,756,815 | 7/1988 | Turner et al. | 204/298 MC |
| 4,770,590 | 9/1988 | Hugues et al. | 414/172 |
| 4,808,291 | 2/1989 | Denton et al. | 204/298 |
| 4,820,106 | 4/1989 | Walde et al. | 204/298 MC |

FOREIGN PATENT DOCUMENTS

| | | |
|---|---|---|
| 3306870 | 8/1984 | Fed. Rep. of Germany . |
| 3413001 | 1/1985 | Fed. Rep. of Germany . |
| 3717712 | 12/1989 | Fed. Rep. of Germany . |
| 500768 | 2/1971 | Switzerland . |

OTHER PUBLICATIONS

Siegle, Gert "*Herstellung dunner Metallschichten durch Kathodenzerstaubung*", mrv. metallpraxis/oberflachentechnik pp. 247-253.

*Primary Examiner*—Nam X. Nguyen
*Attorney, Agent, or Firm*—Hill, Van Santen, Steadman & Simpson

[57] ABSTRACT

A cathode sputtering system comprising an annularly-shaped process chamber and a correspondingly annularly-shaped substrate carrier accommodated therein. The chamber and carrier are positioned vertically. A cathode station and a loading and unloading station are positioned on vertical walls of the chamber.

20 Claims, 7 Drawing Sheets

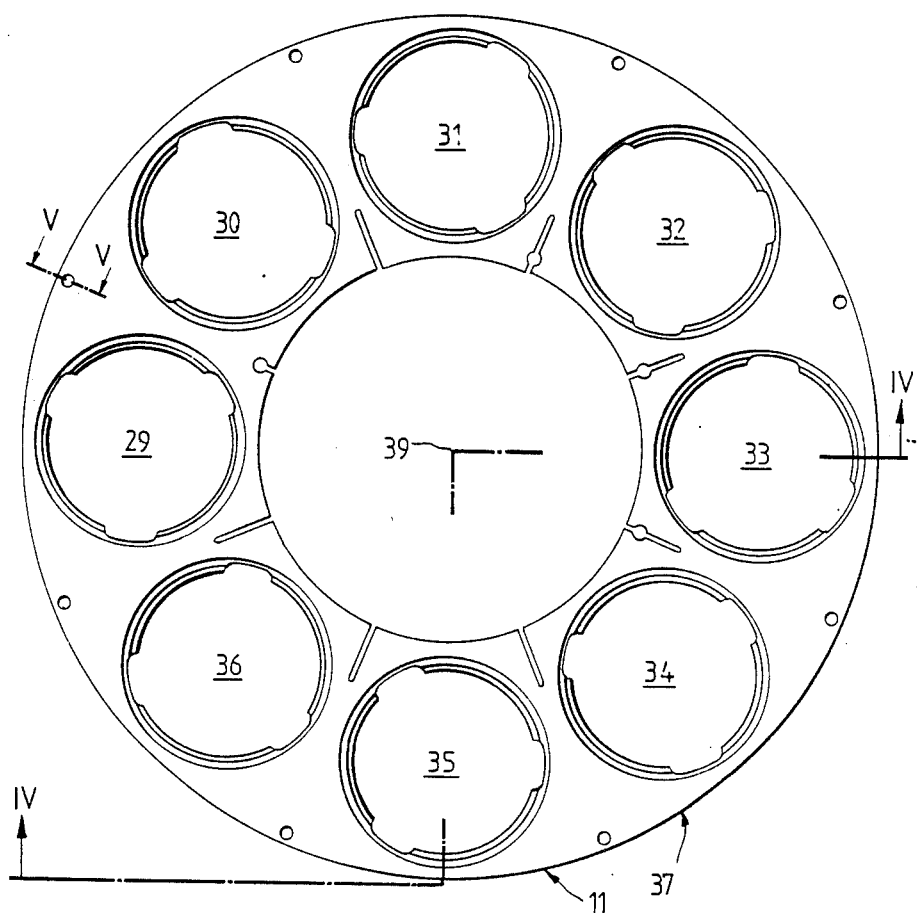

CATHODE SPUTTERING SYSTEM

BACKGROUND OF THE INVENTION

The present invention generally relates to cathode sputtering systems for coating substrates. More specifically, the invention relates to a cathode sputtering system having a process chamber within which is accommodated a rotating substrate carrier and to which are attached a cathode station and a loading and unloading station.

The sputter coating of substrates, for example, compact disks (CDs), is well known in vacuum processing technology, particularly thin film technology. CDs are a modern storage medium. Imprinted disks are sputter coated with a layer, for example, an aluminum layer having a thickness of less than one ten-thousandth of a millimeter.

The process chambers of a sputter coating system utilized for these purposes generally are of an annular construction. A robot loads and unloads substrates to and from the systems in a clean room via a sluice. A substrate carrier then conveys the substrates through the annular process chamber. Sputtering ensues via a high-power sputtering cathode constructed a magnetron.

Such a system is described in a brochure numbered 12-710.01 produced by Leybold-Heraeris GmbH. This known cathode sputtering system provides single sided coating of a substrate with a laser-reflecting aluminum layer. The system comprises an annular, horizontally oriented vacuum (process) chamber including a substrate loading and unloading station, a high-power sputtering cathode, a substrate carrier having a conveyor ring with a disk receptacle, and dynamic sluices for isolating pressure between the vacuum chamber and the loading and unloading station.

SUMMARY OF THE INVENTION

The present invention provides an improved cathode sputtering system. In the system of the invention, more cathode stations, measuring stations, and other stations having functions such as loading and unloading the process chamber are accommodated than was possible in previous systems. With this system, space is used more efficiently because the frame for the process chamber serves as a carrier for pertinent supply lines. Moreover, the system can be accessed from all sides, enabling maintenance, replacement, and repair work to be carried out in a simpler fashion. The system can be directly coupled into the flow of a manufacturing process.

Further, the invention provides for prevention against sputter coating of the substrate carrier conveyor ring. Improved sealing is provided between the loading and unloading station and the process chamber.

Yet further, the invention provides a substrate carrier conveyor ring of a light weight design that requires less driving forces.

To these ends, in an embodiment, the invention comprises a vertically or approximayely vertically positioned process chamber and a vertically or approximately vertically positioned substrate carrier. A cathode stations and a loading and unloading station are located on the vertical walls of the process chamber.

A device is provided for driving the substrate carrier. This drive is positioned so as to engage an outer circumference of the substrate carrier.

Preferably, the drive is constructed as a friction drive having a splined profile, the spline encircling the circumference of the drive. The splined profile engages a corresponding groove formed about the circumference of the substrate carrier.

The substrate carrier preferably is constructed as a ring conveyor. Located along the ring are one or more receptacles within which are received the substrates.

To achieve two-sided sputter-coating of a substrate, the process chamber preferably is provided with two cathodes mounted so as to be spaced apart by a predetermined angular distance.

Alternatively, the process chamber can be provided on opposite walls and on a common horizontal axis. Thus, the cathodes would directly face each other on the common axis.

Undesirable sputter-coating of the ring conveyor preferably is avoided by use of a mask member. The mask member is positioned between the cathode and the substrate. The mask member covers all elements of the process chamber and substrate carrier with an appropriate opening for a substrate positioned to be sputter-coated.

Preferably, the mask member is movable along an axis of the cathode. Further, the mask member preferably has a conically-shaped or tapered interior leading to the substrate.

The mask member is only slightly spaced apart from the substrate. This spacing is about 0.3 mm.

When a cathode station is employed that includes two cathodes mounted opposite each other, it is preferred that two oppositely arranged mask members are also provided.

To achieve good sealing between the loading and unloading station and the process chamber, the loading and unloading station preferably comprises two connecting sleeves positioned on opposite sides of the chamber. The sleeves are designed to be pressed against the process chamber and to register with openings in the chamber. The sleeves then form a transfer chamber for the transfer of substrates to and from the process chamber.

These connecting sleeve elements preferably are coupled to pressing elements which, in turn, are driven by rotating spindles having oppositely threaded ends that operatively engage the pressing members. Rotation of the spindles causes the pressing members to move toward and away from the process chamber and, in turn, the connecting sleeves to move toward and away from the process chamber.

Yet further, in the preferred embodiment, a swivel arm is included that carries a cover for closing the transfer chamber provided by the connecting sleeves. The cover is moved into and out of a closing position by means of the arm.

Accordingly, an advantage of the invention is an improved cathode sputtering system.

Yet another advantage is a cathode sputtering system wherein easy access to all sides can be had.

Another advantage of the invention is a cathode sputtering system that can readily be integrated into a manufacturing process.

A further advantage of the invention is a cathode sputtering system wherein sputter coating of components of the system is minimized.

These and other advantages will become more apparent with reference to the following detailed description and the accompanying drawings.

BRIEF DESCRIPTION OF THE DRAWINGS

FIG. 3 illustrates in plan view a substrate carrier conveyor ring employed in the system of FIGS. 1 and 2.

FIG. 4 is a cross sectional view of the ring of FIG. 3 taken along the line IV—IV.

FIG. 5 is a fragmentary cross sectional view of the ring of FIG. 3 taken along the line V—V.

DETAILED DESCRIPTION OF THE PRESENTLY PREFERRED EMBODIMENTS

Figure 1:
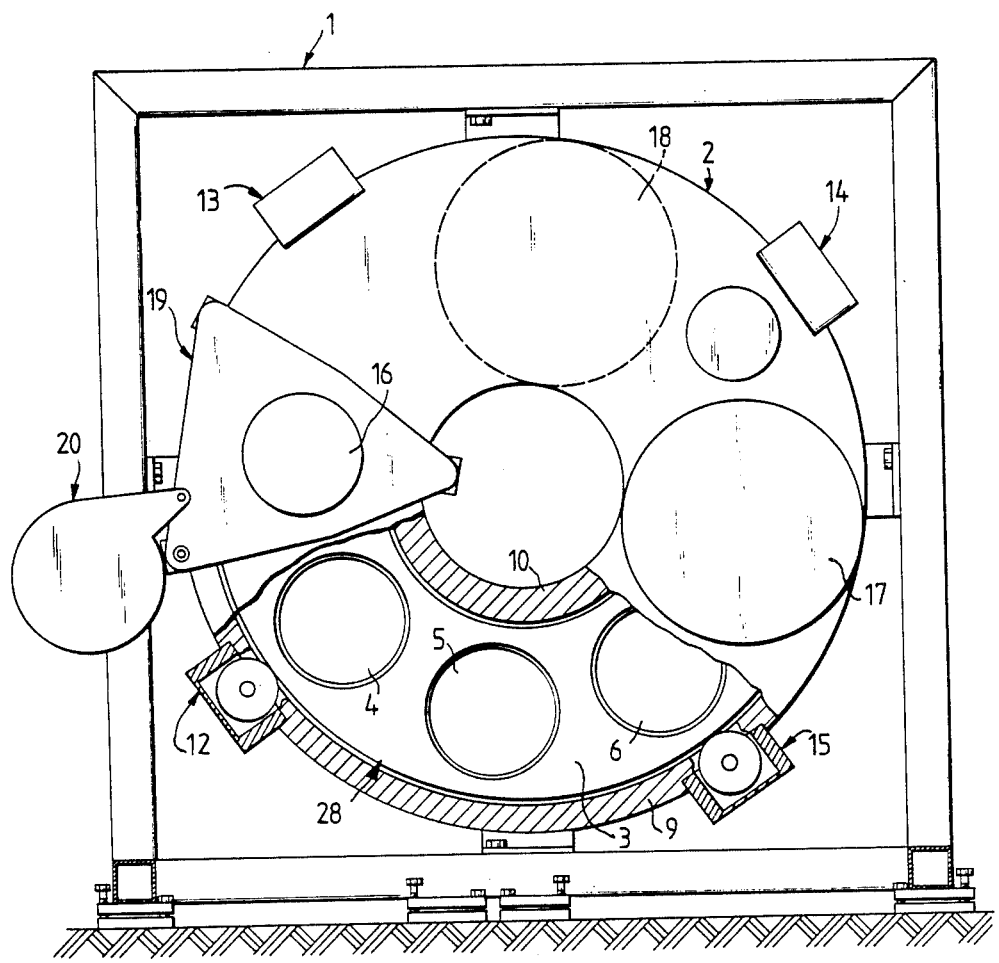
FIG. 1 is a side elevational view of a system embodying principles of the invention looking in the direction of arrow I of FIG. 2.
Figure 2:
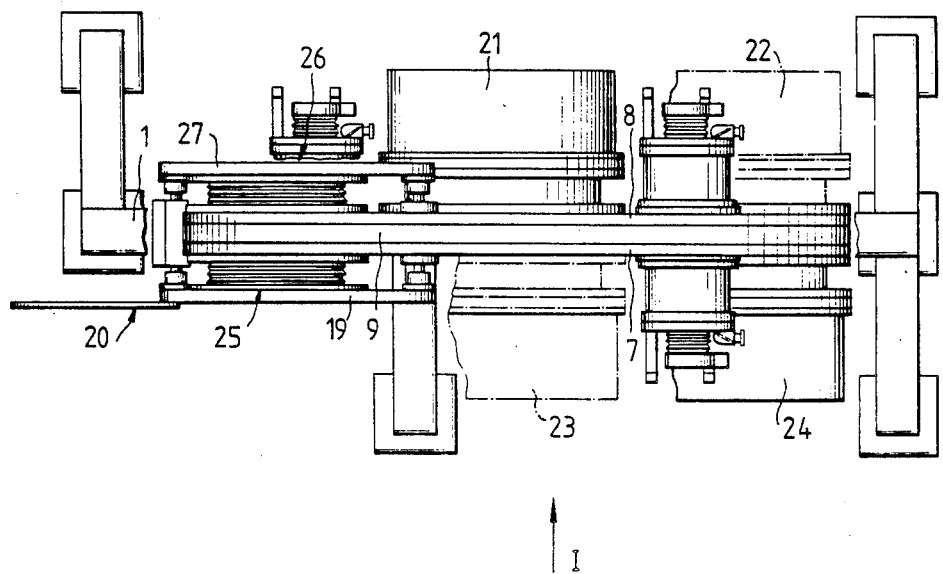
FIG. 2 is a top plan view of the system of FIG. 1.

In FIGS. 1 and 2, there is illustrated a cathode sputtering system 2 embodying principles of the invention. The system 2 is supported within a frame or stand 1. The physical appearance of the system 2 is generally established by a process or vacuum chamber 28.

As illustrated, the process chamber 28 generally is of an annular planar shape, i.e., the chamber 28 is bounded by a inner annular wall 10 and outer annular wall 9 and two flat ring shaped walls 7 and 8. As illustrated more clearly in FIG. 2, the chamber 28 is oriented so that an axis of the chamber 28 is horizontally oriented.

In a cross section taken along a horizontal plane, the chamber 28 has a rectangular cross section. These two vertical ring shaped walls 7 and 8 are connected via the outer annular wall 9 and via the inner annular wall 10.

In FIG. 1, the chamber 28 is illustrated with a portion partially broken away to expose a rotatable substrate carrier 3. It can be appreciated that the carrier 3 rotates within the chamber 28 and is adapted to accept substrates within appropriate receptacles 4, 5, and 6 formed therein.

The substrate carrier 3 is shaped so as to conform to the shape of the chamber 28. To this end, the carrier 3 comprises a flat ring shaped conveyor 11. The ring conveyor 11 is illustrated more clearly in FIGS. 3-5.

As illustrated in FIG. 1, the conveyor ring 3 is rotated within the chamber 28 by means of a plurality drive mechanisms 12, 13 14, and 15. There drive mechanisms are more fully described below.

Substrate loading and unloading of the system 2 is provided via a loading and unloading station 16. Sputter coating of the substrates is provided via sputtering cathodes 17 and 18.

Figure 9:
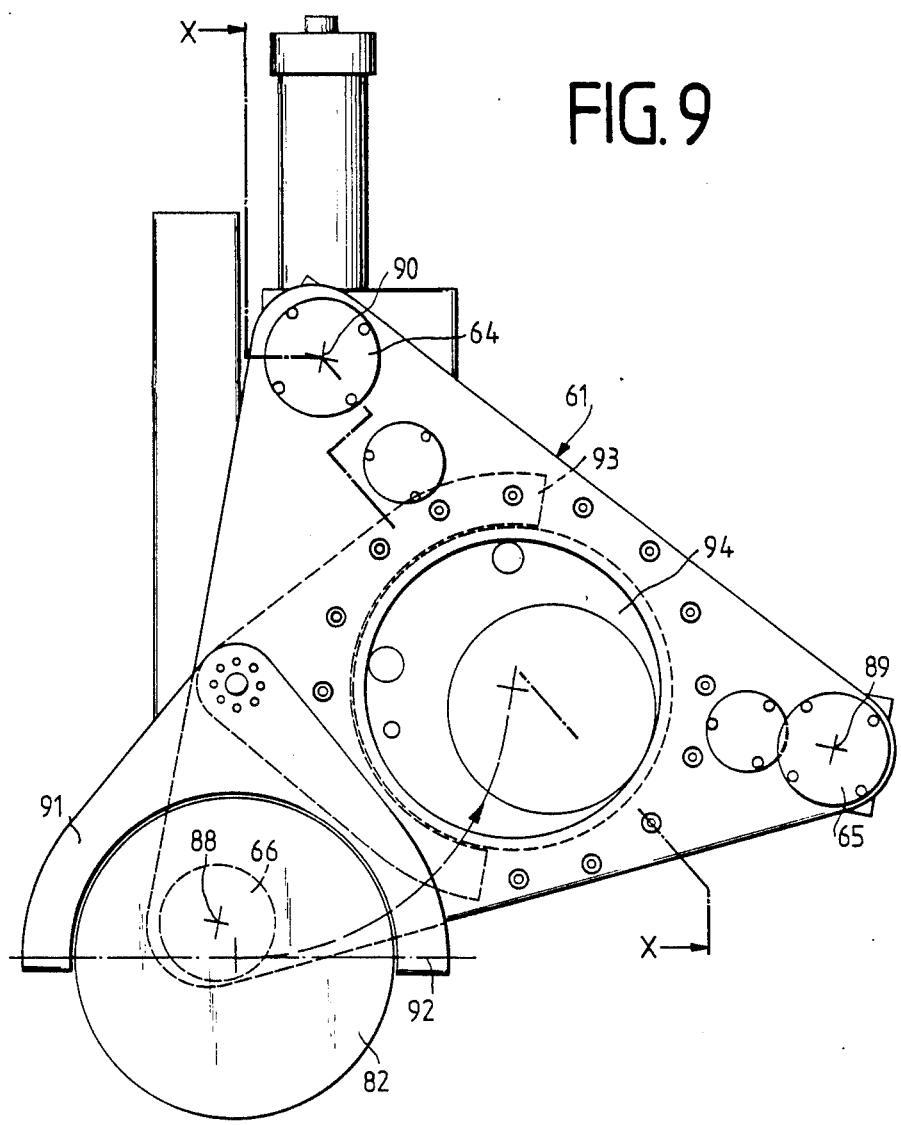
FIG. 9 is a side elevational view of a loading and unloading station employed in the system of FIGS. 1 and 2 looking in the direction of arrow IX.

The loading and unloading station 16 is illustrated in greater detail in FIG. 9. However, in FIGS. 1 and 2, it can be seen that the station 16 includes two triangularly-shaped plates 19 and 27 mounted on opposite sides of the chamber 28. The triangular plate 19 has a substrate opening which cooperates and registers with an appropriate opening in the chamber 28. A cover 20 operatively swivels between opened and closed positions over the opening of the plate 19.

Between the plates 19 and 27 and the chamber 28 are provided bellow type seals 25 and 26. Seal 25 seals between the plate 19 and the chamber 28. Seal 26 seals between the plate 27 and the chamber 28. Then seals are provided due to the axial mobility of the plates 19 and 27 relative to the chamber 28 as will become clearer below.

In FIG. 2, it can be seen that the cathode stations 17 and 18 comprise four cathodes 22, 24 and 21, 23, respectively, cathodes 21 and 23 and 22 and 24 being oriented and positioned opposite each other, respectively, on the opposite sides of the chamber 28. These cathodes are illustrated in greater detail in FIG. 8.

It can be appreciated from FIG. 2 that the system 2 occupies only a small amount of space. Further, all parts of the system 2 are easily accessible from the various sides of the system 2.

It can also be appreciated that the lengths of supply lines between the chamber 28 and coupling elements on the frame 10 need not be long. Instead, these lengths advantageously can be very short.

In FIGS. 3-5, the carrier ring conveyor 11 is illustrated in greater detail. Therein it can be seen that the ring 11 comprises eight substrate receptacle openings 29, 30, 31, 32, 33, 34, 35 and 36. Substrate holding receptacles that receive disk shaped substrates are mounted or formed within these openings 29-36.

It can be appreciated that the ring 11 rotates within the chamber 28 to convey substrates to the various stations for unloading, measuring, sputter coating, or the like. The ring 11 rotates about an axis 39.

The ring 11 includes an outer periphery 37 by which the ring 22 is driven. As illustrated in FIG. 5, the periphery 37 in cross section comprises a channel or groove 38 adapted to receive a cooperating driving wheel having an appropriate spliced periphery. The channel 38 runs the entire periphery 37.

Figure 6:
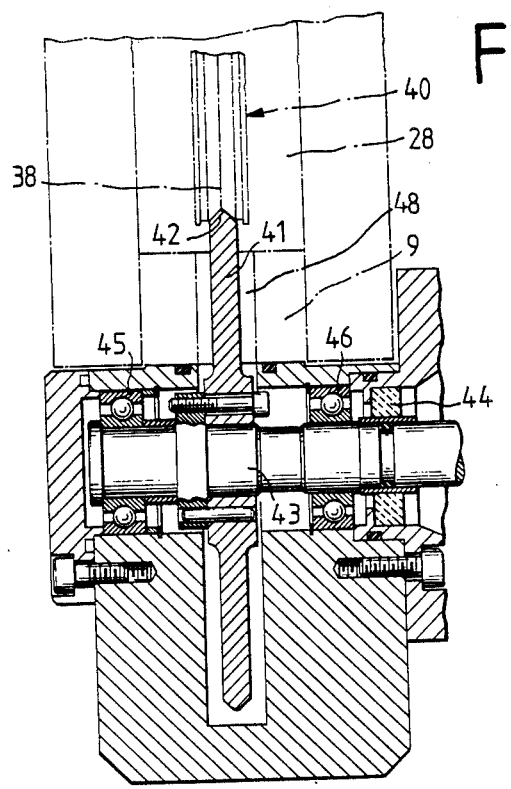
FIG. 6 is a cross sectional view of a drive of FIG. 7 for the conveyor ring of FIGS. 3 to 5, taken along the line VI—VI of FIG. 7.
Figure 7:
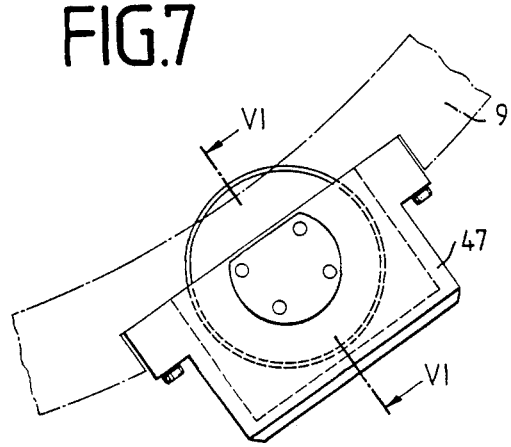
FIG. 7 illustrates in plan view a drive for the conveyor ring of FIGS. 3 to 5.

In FIGS. 6 and 7, one of the drive mechanisms 12-15, is illustrated in greater detail. As previously discussed, the drive mechanism is employed to drive the substrate carrier 3, the ring conveyor of which is designated by the numeral 40. The following description is applicable to each drive mechanism 12-15 although reference is made only to the drive mechanism illustrated in FIGS. 6 and 7.

The ring 40 is driven by a friction drive wheel 41 that engages the channel 38 by means of a splined periphery 22. A cross sectional profile of the wheel 41 illustrates the peripheral spline 42 that conforms to the cross sectional profile of the channel 38.

The wheel 41 is mounted within the chamber 28. Accordingly, a drive shaft 43 of the wheel 41 is sealed from the exterior of the chamber 28 by means of an appropriate vacuum seal 44. The shaft 43 includes appropriate bearings 45 and 46.

In FIG. 7, it can be seen that the wheel 41 is mounted within a housing 47 which in turn is mounted on an external portion of the annular wall 9. It can be appreciated that the wheel 41 thus projects through an opening 48 in the wall 9 and into the larger interior of the chamber 28. However, because the interior of the housing 47 is in communication with the interior of process chamber 28, both interiors essentially comprise the interior of chamber 28.

Figure 8:
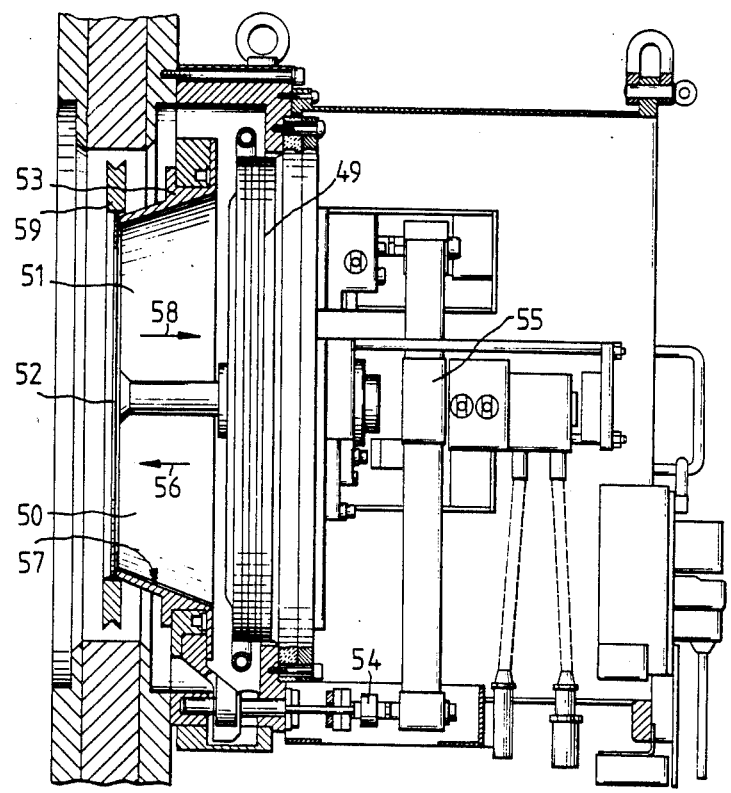
FIG. 8 is a cross sectional view of a cathode station employed in the system of FIGS. 1 and 2.

In FIG. 8 there is illustrated one of the sputtering cathodes 21-24. The cathode is a high power sputtering cathode provided by a magnetic field. Such cathodes are also referred to as magnetrons. The following description is applicable to all of the cathodes 21-24 although reference is made only to the illustrated cathode.

In FIG. 8, the actual target cathode 49 can be seen. When the cathode 49 is placed in operation, a plasma is formed in the regions 50 and 51 above the cathode 49. The plasma is held and constrained together by means of a magnetic field in the regions 50 and 51. Positively charge ions of the plasma bombard the target cathode 49 and sputter particles of coating material out of the target cathode 49 onto a substrate 52 to coat same.

Positioned between the cathode 49 and the substrate carrier ring conveyor 59 is a mask member 53. The mask member 53 is axially movable relative to the cathode 49 in the directions of the arrows 50 and 58. To this end, a lifting unit 54, 55 is provided. Before the substrate 52 is sputter coated, the mask member 53 is positioned over the substrate 52 by being moved in the direction of the arrow 56.

Once the sputter coating has been completed, the mask member 53 is moved axially in the direction of the arrow 58 so that the ring conveyor 59 can be rotated. The substrate is then rotated or conveyed to another station.

It can be seen in FIG. 8 that the mask member 53 has a substantial conical or infundibular shape. This shape ensures that the ring conveyor 59 is not sputter coated.

It can be appreciated that a plurality of cathodes such as that described above can be positioned on either one or both walls 6 and 7 of the chamber 28. The cathodes can be positioned opposite each other or in staggered positions, thus, providing for a variety of sputter coating options.

Figure 10:
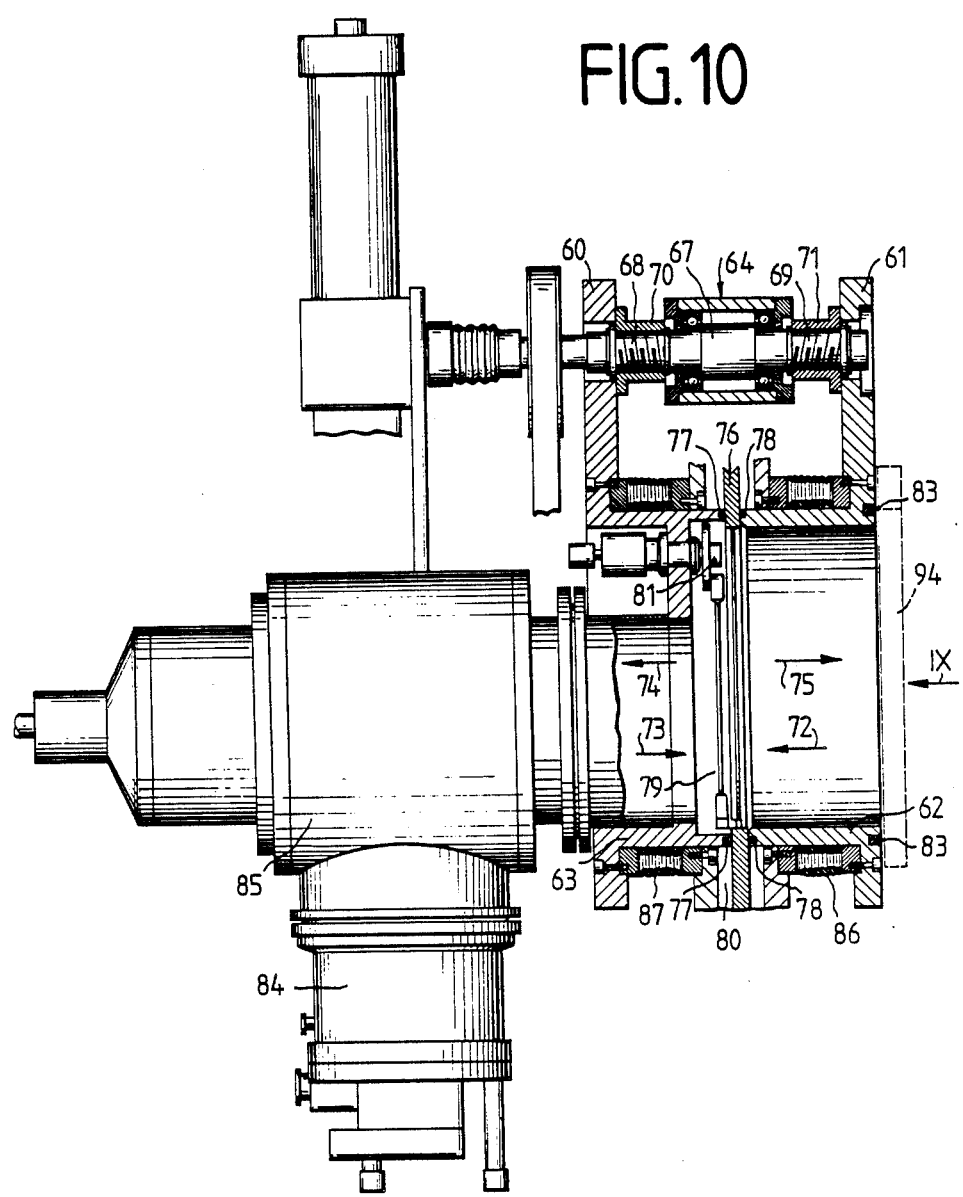
FIG. 10 is a cross sectional view of the loading and unloading station of FIG. 9 taken along the line X—X.

In FIGS. 9 and 10, the loading and unloading station 16 is illustrated in greater detail. As illustrated, the station 16 includes two triangularly shape plates 60 and 61. These plates 60 and 61 act as pressing members.

Connecting sleeves 62 and 63 are coupled to the plates 61 and 62, respectively, the connecting sleeves 63 and 62 being provided between the plates 60 and 61 and the chamber 28, respectively, to provide chambers communicating between the openings in the plates 61 and 62 and the chamber 28.

Pressing mechanisms members 64, 65 and 66 are mounted between aligned corners of the plates 60 and 61. In FIG. 10, the pressing mechanism member 64 is illustrated in cross sectional view in greater detail.

From FIG. 10 it can be seen that each of the pressing mechanisms comprises a spindle 67 having left and right hand threaded portions 68 and 69, respectively. Axes 88, 89 and 90 of the spindles are depicted most clearly in FIG. 9. These threaded portions operatively engage appropriate nuts 70 and 71, respectively, that the plates 60 and 61, respectively.

Depending upon the rotational direction of the spindle 67, the plates 60 and 61 and connecting sleeves 60 attached thereto move toward or away from each other in the direction of the arrows 72 and 73 or 74 and 75, respectively.

In FIG. 10, the ring conveyor is referenced by the numeral 76. O-rings 77 and 78 seal between the ring conveyor 76 and the connecting 63 and 62, respectively.

It can be appreciated that when the connecting sleeves 62 and 63 are moved toward each other, they sandwich therebetween the ring conveyor 76. The sleeves 62 and 63 then form a closed cylindrical chamber that is isolated from the interior of the process chamber 80. This cylindrical chamber provides a substrate transfer chamber wherein a substrate is transferred into and out from the chamber 80.

Because the chamber formed by the sleeves 62 and 63 can be pressure isolated from the process chamber 80, the chamber acts as a sluice. Accordingly, the resultant sluice can be placed under atmosphere pressure for transferring a substrate into or out from the system. Thus, a coated substrate can be removed from the sluice and a new substrate inserted into receptacle 81 for conveyance through the process chamber 80.

After a substrate is ready for conveyance the chamber 80, the sluice is sealed and placed under vacuum pressure by means of the cover 94 (cover 20 in FIG. 1). The sealing is provided by o-ring 83. Vacuum pressure is provided by means of valve 85.

As further illustrated in FIG. 10, the sleeve members 63 and 62 are isolated and sealed from the atmosphere by means of cylindrical membrane bellow seals 86 and 87, respectively.

Although modifications and changes may be suggested by those skilled in the art it is the intention of the inventor to embody within the patent warranted hereon all changes and modifications as reasonably and properly come within the scope of his contribution to the art.

I claim as my invention:

1. A cathode sputtering system for coating substrates, comprising:
    an annularly shaped process chamber oriented about a horizontal axis, said chamber having a plurality of vertical walls;
    an annularly shaped substrate carrier accommodated within the process chamber and oriented about the horizontal axis;
    at least one cathode station mounted on a vertical wall of the chamber; and
    at least one substrate loading and unloading station mounted on a vertical wall of the chamber.

2. The cathode sputtering system of claim 1, further comprising at least one means for driving the substrate carrier arranged adjacent an outer circumference of the carrier.

3. The cathode sputtering system of claim 1, further comprising a friction drive for driving the substrate carrier.

4. The cathode sputtering system of claim 3, wherein the friction drive comprises a friction disk having an outer splined profile and a cooperating inverted profile on the carrier engaging said disk.

5. The cathode sputtering system of claim 1, wherein the substrate carrier comprises a ring having one or more receptacles within which is received a substrate.

6. The cathode sputtering system of claim 1, wherein a first cathode station is mounted on a first wall of said chamber and a second cathode station is mounted on a second wall of said chamber positioned opposite the first cathode station, the second cathode station being spaced apart from the first cathode station by a predetermined angular dimension.

7. The cathode sputtering system of claim 1, wherein the at least one cathode station comprises two cathodes oriented opposite each other and positioned along a common horizontal axis.

8. The cathode sputtering system of claim 1 further comprising a mask member positioned between the at least one cathode and the substrate carrier.

9. The cathode sputtering system of claim 8, wherein the mask member is mounted to be moveable toward and away from the carrier but otherwise static relative to the carrier.

10. The cathode sputtering system of claim 9, wherein the mask member includes a tapered guide surface so that the mask has a diameter that is large enough at an appropriate cross section to prevent sputter coating of the substrate carrier.

11. The cathode sputtering system of claim 1, comprising a first cathode mounted on a first wall of said chamber and having a cooperating mask member and a second cathode mounted on a second wall of said chamber opposite the first cathode and having a cooperating mask member, the second cathode being spaced apart from the first cathode by a predetermined angle.

12. The cathode sputtering system of claim 1, comprising two oppositely oriented cathodes, each having a cooperating mask member.

13. The cathode system of claim 1, wherein the at least one loading and unloading station comprises two sleeve elements positioned on opposite sides of the substrate carrier, the sleeve elements being pressable against the carrier and comprising at least a portion of an inward and outward substrate transfer chamber.

14. The cathode sputtering system of claim 13, wherein the sleeve elements are connected to support elements that move relative to each other by means of pressing members.

15. The cathode sputtering system of claim 14, wherein the pressing member comprises a spindle member having left and right hand threaded portions, one threaded portion rotating in threaded engagement in one supporting element and the other threaded portion rotating in threaded engagement in the other supporting element so as to selectively cause the sleeve elements to move toward and away from the substrate carrier.

16. The cathode sputtering system of claim 15, wherein the supporting elements comprise triangularly shaped plate members, with separate pressing members engaging within each corner of a supporting element.

17. The cathode sputtering system of claim 13, further comprising a swivel arm to which is attached a closing cover that cooperates with the inward and outward substrate transfer chamber, the swivel arm operatively moving the closing cover in front of the chamber in a closed position and pivoting the closing cover outward in position in an open position.

18. The cathode sputtering system of claim 13, further comprising membrane bellows operatively connected to the sleeve elements for sealing between the sleeve element and the process chamber about perimeters of the sleeve elements.

19. A cathode sputtering system for coating substrates, comprising:
- an annularly shaped process chamber having a horizontal axis, said chamber including concentric inner and outer annular walls connected to two ring shaped vertical walls;
- an annularly shaped substrate turntable positioned within the process chamber and oriented about the horizontal axis;
- at least one cathode station mounted on one of the vertical walls of the chamber; and
- at least one substrate loading and unloading station mounted on one of the vertical walls of the chamber.

20. A cathode sputtering system for coating substrates, comprising:
- a ring-shaped process chamber having a horizontal axis, said chamber including concentric inner and outer annular walls to which are connected two vertical ring shaped walls;
- a ring-shaped substrate turntable positioned within the process chamber and oriented about the horizontal axis;
- at least one cathode station mounted on one of the vertical walls of the chamber;
- at least one substrate loading and unloading station mounted on one of the vertical walls of the chamber; and
- drive wheels positioned about the outer annular wall of the process chamber, said drive wheels operatively engaging said substrate turntable to effect rotation of same.

* * * * *